US011175215B2

United States Patent
Birch et al.

(10) Patent No.: US 11,175,215 B2
(45) Date of Patent: Nov. 16, 2021

(54) METHODS, SYSTEMS, AND APPARATUS FOR PROGRESSIVE CORROSION DETECTION

(71) Applicant: Intel Corporation, Santa Clara, CA (US)

(72) Inventors: Thomas Birch, Portland, OR (US); Barry Kennedy, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 110 days.

(21) Appl. No.: 16/586,840

(22) Filed: Sep. 27, 2019

(65) Prior Publication Data

US 2020/0025671 A1    Jan. 23, 2020

(51) Int. Cl.
*G01N 17/02*    (2006.01)
*G01R 17/02*    (2006.01)
*G01R 17/10*    (2006.01)

(52) U.S. Cl.
CPC .............. *G01N 17/02* (2013.01); *G01R 17/02* (2013.01); *G01R 17/10* (2013.01)

(58) Field of Classification Search
CPC ........ G01N 17/02; G01N 17/04; G01R 17/02; G01R 17/10; G01R 31/2818; G01R 31/2817; G01R 31/2812
See application file for complete search history.

(56) References Cited

U.S. PATENT DOCUMENTS

| | | | | |
|---|---|---|---|---|
| 4,328,503 A | * | 5/1982 | Berkowitz | B41J 2/43 101/113 |
| 5,641,681 A | * | 6/1997 | Carter | C30B 7/14 117/201 |
| 2007/0144272 A1 | * | 6/2007 | Yu | G01N 17/02 73/862.046 |
| 2008/0087544 A1 | * | 4/2008 | Zhou | G01N 27/48 204/406 |
| 2009/0009048 A1 | * | 1/2009 | Yoshimoto | H01T 13/39 313/142 |
| 2009/0162076 A1 | * | 6/2009 | Wang | G01N 17/02 398/185 |
| 2013/0265064 A1 | * | 10/2013 | Hamann | G01N 17/04 324/700 |
| 2018/0284011 A1 | * | 10/2018 | Farkas | G01R 17/02 |
| 2020/0326292 A1 | * | 10/2020 | Xu | G01N 27/045 |

* cited by examiner

*Primary Examiner* — Akm Zakaria
(74) *Attorney, Agent, or Firm* — Hanley, Flight & Zimmerman, LLC (57) ABSTRACT

Apparatus, systems, and methods for progressive corrosion detection are disclosed. An example apparatus includes a query generator to query a multiplexer channel to receive an output voltage, the multiplexer channel linked to a fin group of an electrode array, the fin group forming an open circuit in the absence of conductive crystal formation, a quantifier to determine, using a reference voltage, a difference between the reference voltage and the output voltage from the queried multiplexer channel, and a contamination level comparator to identify presence of conductive crystal formation based on the difference between the reference voltage and the output voltage.

24 Claims, 7 Drawing Sheets

METHODS, SYSTEMS, AND APPARATUS FOR PROGRESSIVE CORROSION DETECTION

FIELD OF THE DISCLOSURE

This disclosure relates generally to corrosion detection, and, more particularly, to methods, systems, and apparatus for progressive corrosion detection.

BACKGROUND

Environmental factors that can cause corrosion of circuit boards in industrial situations include temperature, humidity, and gaseous pollutants. Example sources of gaseous pollution include fuel burning emissions from power plants, factories, commercial and domestic buildings, and automobiles. Gaseous pollutants resulting from industrial operations include acidic or oxidizing pollutants such as hydrogen sulfide ($H_2S$), carbonyl sulfide (COS), sulfur dioxide ($SO_2$), and carbon disulfate ($CS_2$).

The figures are not to scale. Instead, the thickness of the layers or regions may be enlarged in the drawings. In general, the same reference numbers will be used throughout the drawing(s) and accompanying written description to refer to the same or like parts. Stating that any part is in contact with another part means that there is no intermediate part between the two parts. Although the figures show layers and regions with clean lines and boundaries, some or all of these lines and/or boundaries may be idealized. In reality, the boundaries and/or lines may be unobservable, blended, and/or irregular.

Descriptors "first," "second," "third," etc. are used herein when identifying multiple elements or components which may be referred to separately. Unless otherwise specified or understood based on their context of use, such descriptors are not intended to impute any meaning of priority or ordering in time but merely as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

DETAILED DESCRIPTION

Copper and copper alloys are widely used as base materials for electrical contacts to allow electrical conduction. However, such copper and copper alloys are prone to corrosion. Plating with gold, tin, or nickel can increase resistance to corrosion while preserving conductivity, but thin plating layers are nonetheless prone to corrosion due to the presence of pores in the plating. Porous plating surfaces permit the passage of adsorbed corrosive gases through the metal plating and into contact with the base metal, thereby causing corrosion.

Air pollutants known to cause corrosion in electronic devices, structures, and/or components include hydrogen sulfide ($H_2S$), carbonyl sulfide (COS), sulfur dioxide ($SO_2$), and carbon disulfate ($CS_2$). Electronic devices (e.g., a printed circuit board (PCB)) that are regularly and/or continuously exposed to highly polluted environments exhibit higher failure rates than similar devices with less exposure to such environments. For example, a mean time between failures (MTBF), which is a metric indicative of hardware product/component reliability, is lower for electronic assemblies with exposure to corrosive gases in highly polluted air due to compound deposition (e.g., $H_2S$, COS, $SO_2$, etc.) within these assemblies. Interaction of these compounds in the air with the base materials (e.g., copper) of these hardware devices triggers crystal compound formation. Overtime, such crystals can grow in size to bridge electrical contacts, shorting out or causing system failure of some or all of the electronics. Corrosion of electronic assemblies not only contributes to direct and indirect costs of assembly failures, but also presents a significant safety concern, particularly in high voltage systems.

Known crystal growth rate detection enables planned preventative maintenance in an attempt to avoid unplanned downtime and outages. In a known approach to such detection, distribution centers contract with a third party to deploy test strips throughout the center for a period of approximately one month. At the end of the month, the strips are collected and sent to a third party laboratory for analysis related to crystal growth rate. A report of the results is generated and preventative maintenance is scheduled based on the results. Such an assessment of global distribution center conditions does not account for local conditions of each electronic assembly, is slow, inaccurate, and costly. Instead, the known assessment is of the distribution center itself and not the particulars of each electronic device. Furthermore, there is a broad assumption of a "healthy" or an "unhealthy" status of each device without consideration of conditions that may affect MTBF results due to depositions of corrosive buildup (e.g., systems with high volume air flow can experience faster or slower depositions than systems exposed to limited air flow). To reduce risk of electronic assembly failure due to corrosion, it is important to be aware of such a risk during multiple stages of a manufacturing process, including design stage, reliability evaluations and qualifications, assembly processes, storage, shipping, and final use. Known approaches do not facilitate such multiple stage analyses.

Deterioration of a base metal resulting from chemical reactions with its environment is expedited in the presence of heat and moisture. Corrosion products (e.g., corrosive crystal growth) can form insulating layers on a circuit, leading to thermal failure or short-circuits. Active sulfur compounds (e.g., $H_2S$) rapidly attack copper, silver, aluminum, and iron alloys, even at low parts per billion (ppb) levels. Additional presence of moisture, inorganic chlorine compounds and/or nitrogen oxides further accelerates sulfide-based corrosion. Even in low relative humidity environments, active sulfur ranks as the predominant cause of atmospheric corrosion in process industries. While the severity of the environment (e.g., types and levels of gases, humidity, temperature, etc.) determines corrosion speed, the end result is disruption of the electrical current flow (e.g., disruption of a contact point). Microscopic crystal growth occurs on the surface of conductive metals (e.g., presence of silver sulfide on a silver surface leads to "whisker" growths on circuitry). Electronic components with particular sensitivity to corrosion include edge connectors, pin connectors, and wire-wrap connections.

Example methods, apparatus, and systems for progressive corrosion detection of electronics disclosed herein allow for improved monitoring of local electronic assembly environments and/or early detection of corrosion and/or conditions conducive to corrosion. Examples disclosed herein permit evaluation of corrosive exposure values on each electronic assembly unit individually. In examples disclosed herein, electrode fin groups are implemented to track the progression of conductive crystal growths resulting from corrosion processes. Furthermore, examples disclosed herein allow for a variety of electrode-based corrosion detection approaches based on the total area of interest for corrosion monitoring purposes. In examples disclosed herein, a level of contamination can be determined by querying electrode fin groups to obtain and compare changes in input voltage and output voltage over time. As such, change(s) in a voltage across a given electrode fin group can be used to obtain corrosive exposure values. In examples disclosed herein, electrode fin group traces have different distances to accommodate detection of early-stage versus late-stage corrosive crystal formation.

In examples disclosed herein, the electrode fin arrays can be a part of a sacrificial printed circuit board (PCB). Furthermore, in some examples disclosed herein, the sacrificial PCB can be a replaceable unit that can be positioned on the original PCB where detection of corrosive crystal formation is of interest. In some examples disclosed herein, testing the reaction of two or more different metals (e.g., aluminum, tin, silver, etc.) to the environment of the electronics can be performed by using two or more electrode fin groups with different metal compositions.

Examples disclosed herein allow for electrode corrosion monitoring in mission critical infrastructure, where failure would result in critical outages. For example, apparatus and systems disclosed herein can be used in cell tower systems located in heavily populated urban centers where high pollution and corrosive deposits on electronic gear are commonplace.

Examples disclosed herein introduce a low-cost approach to monitoring corrosion in electronics. In examples disclosed herein, a sacrificial PCB can be a few-layer PCB with an inexpensive multiplexer connected to system monitor tools (e.g., a baseboard management controller (BMC)) for measurements. Furthermore, examples disclosed herein allow validation of environments in which warranty claims are filed by detecting the corrosive nature of a given electronic assembly.

Figure 1:
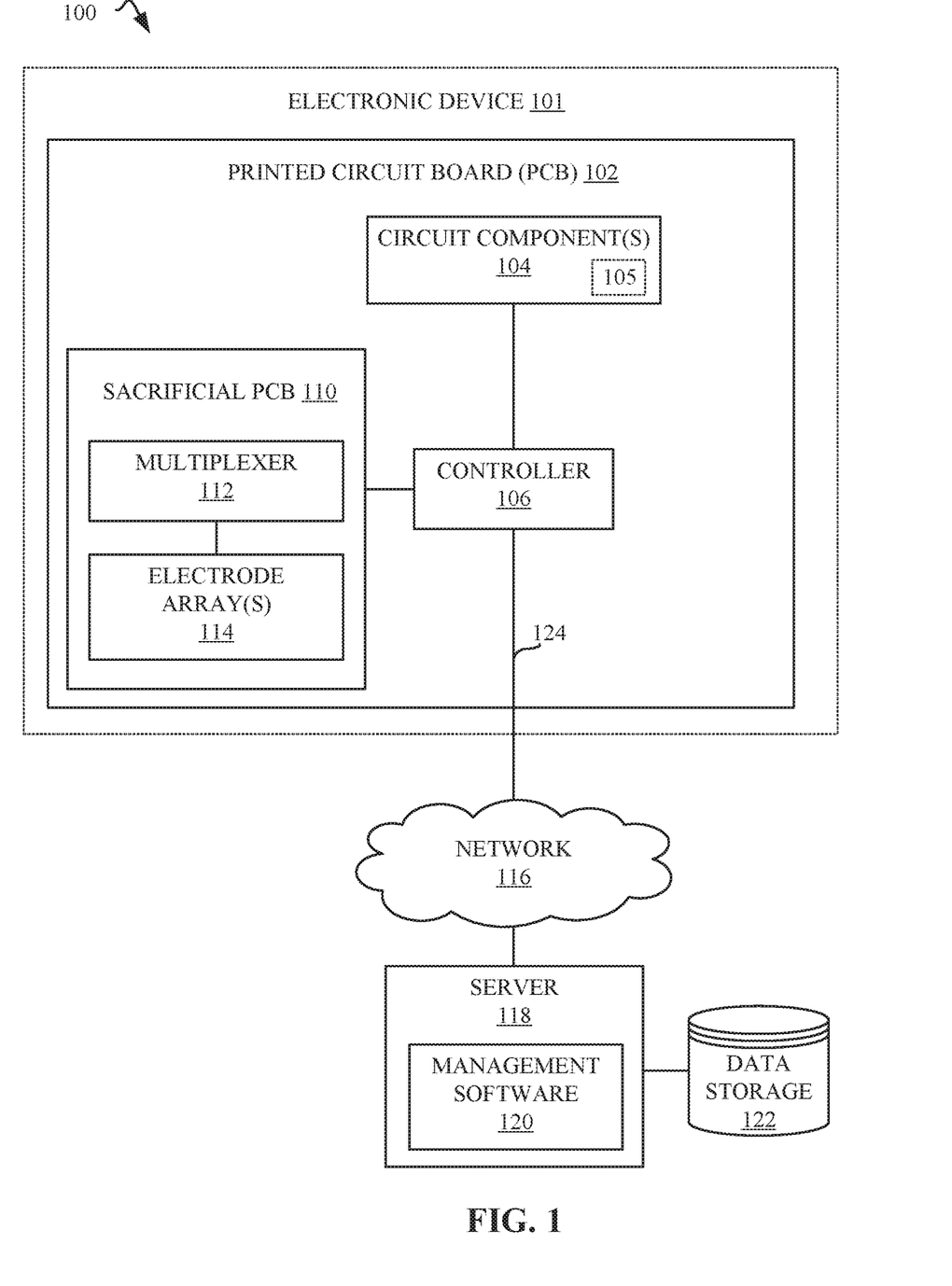
FIG. 1 is a block diagram illustrating an example system, constructed in accordance with teachings of this disclosure, for corrosion detection in an electronic device.

FIG. 1 is a block diagram illustrating an example system 100 for corrosion detection in an electronic device 101. In the example of FIG. 1, the example device 101 includes an example printed circuit board (PCB) 102. The PCB 102 (e.g., main PCB 102) is in connection with an example server 118 via an example network 116. The server 118 is in communication with one or more data storage devices 122. In some examples, the main PCB 102 is in communication with the network 116, the server 118, and the data storage device(s) 122 via an example server management bus (SMB) 124.

The electronic device 101 can be any device with a printed circuit board (e.g., laptop, printer, motor, switch box, server, etc.). In some examples, the electronic device 101 can connect to a server 118 via a network 116.

The main PCB 102 may be part of any type of electronic device 101. In some examples, the main PCB 102 can be located in a personal computer, in a phone, in a consumer electronic device, in a server, or in an Internet of Things (IoT) device. The PCB 102 can be any type of PCB (e.g., double-sided, multi-layer, aluminum-backed, rigid, flexible, rigid flex, etc.). The main PCB 102 includes example circuit component(s) 104, an example controller 106, and an example sacrificial PCB 110. The controller 106 and the sacrificial PCB 110 are mounted to the main PCB 102 along with the circuit component(s) 104. In some examples, the main PCB 102 is a server motherboard.

The circuit component(s) 104 can be any type of circuitry mounted to the example PCB 102 (e.g., electrodes, transistors, switches, inductors, capacitors, integrated circuits, etc.). For example, the circuit component 105 can be an integrated circuit. The circuit component(s) 104 are connected to the main PCB 102 and the controller 106. In some examples, progressive corrosion of circuit component(s) 104 is monitored by the controller and/or example management software 120.

The controller 106 provides an interface between other components of the main PCB 102 (e.g., circuit component(s) 104, sacrificial PCB 110) and the server 118. The controller 106 receives the transmission of one or more analog or digital signals from the sacrificial PCB 110 and/or the example circuit component(s) 104. In some examples, the controller 106 monitors the level of contamination within the main PCB 102 by querying the sacrificial PCB 110 to obtain output voltage values registered at the sacrificial PCB 110. By querying the sacrificial PCB 110 to obtain output voltage values, the controller 106 identifies progression of conductive crystal formations resulting from corrosion, as detailed below in FIG. 2. For example, the controller 106 can provide an input voltage to the sacrificial PCB 110 to monitor changes in output voltage values from the sacrificial PCB 110. In some examples, the controller 106 monitors the level of contamination over a period of time and compiles available data to determine any sudden changes in crystal formation (e.g., progressive corrosion monitoring).

The sacrificial PCB 110 can be any type of PCB (e.g., double-sided, multi-layer, aluminum-backed, rigid, flexible, rigid flex, etc.). In some examples, the sacrificial PCB 110 is a replaceable unit. In some examples, the sacrificial PCB 110 can be connected to the main PCB 102 server motherboard via a header. In some examples, the PCB 110 can be disconnected from the main PCB 102 in order to replace the unit after a period of time, without requiring any changes to the main PCB 102. The sacrificial PCB 110 of FIG. 1 includes an example multiplexer 112 and example electrode array(s) 114. In some examples, the sacrificial PCB 110 includes the electrode array(s) 114 without the multiplexer 112, such that the multiplexer is located on the main PCB 102. In some examples, the electrode array(s) 114 connect to a multiplexer on the main PCB 102 when the sacrificial PCB 110 is connected to the main PCB 102.

The multiplexer 112 can be any type of multiplexer (e.g., 4-to-1 multiplexer, 16-to-1 multiplexer, etc.). The multiplexer 112 selects one or more analog or digital signals for transmission to the example controller 106. The controller 106 queries one or more channels of the multiplexer 112 to determine an output voltage value for the one or more channels of the multiplexer. The multiplexer 112 channels are connected to one or more electrode array(s) 114. The controller 106 provides an input voltage to the multiplexer 112 channels in order to power the one or more electrode array(s) 114. By powering the electrode array(s) 114 via the multiplexer 112, the controller 106 queries the multiplexer channels to obtain the output voltage values for each of the one or more electrode array(s) 114, as described below in connection with FIG. 2.

The electrode array(s) 114 represent configurations of positive (+) and negative (−) conductive traces forming an open circuit. The open circuit configuration of the electrode array(s) 114 permits measurement of an electric voltage across the conductive traces in the presence of conductive crystal formations when the crystal formations are large enough to bridge the traces to form a closed circuit. A configuration of evenly-spaced traces (e.g., interchanging positive and negative traces spaced apart by 0.1 mm to 2 mm) represents an electrode fin group. Two or more electrode fin groups form an electrode array. In some examples, the traces of each consecutive fin group of an electrode array are incrementally spaced apart. By increasing the spacing between the electrode fin traces (e.g., inter-trace width), the open circuit area increases, requiring larger growths of conductive crystals to bridge the traces to form a conductive closed circuit. In some examples, electrode fin groups with the same inter-trace widths are connected to the same channel of the multiplexer 112. In some examples, the electrode array(s) 114 form a separate unit on a sacrificial PCB 110 that can be connected to a multiplexer located on the main PCB 102.

In some examples, the controller 106 queries the multiplexer 112 channels to obtain a voltage reading from the electrode fin groups forming an electrode array. In the absence of conductive crystal formation, the electrode fin groups maintain an open circuit. For example, an input voltage of 1V ($V_{in}=1V$) provided by the controller 106 via the multiplexer 112 to the electrode array(s) 114 results in a significantly lower output voltage reading (e.g., $V_{out}=0V$) at the multiplexer 112 channel registering the reading across an electrode array 114. In the presence of conductive crystal formation, the electrode fin group traces are bridged to form a closed circuit. The multiplexer 112 registers a voltage across the electrode array when the electrode array includes an electrode fin group with a closed circuit. When the controller 106 queries the multiplexer 112 channel connected to an electrode array with an electrode fin group forming a closed circuit, the input voltage provided by the controller 106 (e.g., $V_{in}=1V$) to power the electrode array results in an output voltage equal to, or higher than, the input voltage (e.g., $V_{out} \geq 1V$).

The network 116 can be used by the controller 106 to connect to the example server 118 and the example management software 120. The network 116 may be implemented using any suitable wired and/or wireless network(s) including, for example, one or more data buses, one or more Local Area Networks (LANs), one or more wireless LANs, one or more cellular networks, the Internet, etc.

The server 118 includes example management software 120 and is connect to example data storage 122. The server 118 can be any type of server that collects and/or receives information from the controller 106 and/or the sacrificial PCB 110.

The management software 120 can query values (e.g., represented by output voltage(s)) from the sacrificial PCB 110 via the controller 106. For example, the controller 106 can be a baseboard management controller (BMC). In some examples, the controller 106 provides a base voltage or nominal voltage (e.g., via analog to digital converters that have a regulated base voltage) to the sacrificial PCB 110 (e.g., via multiplexer 112 to electrode array(s) 114) and is used to observe differences in input voltage ($V_{in}$) versus output voltage ($V_{out}$) values in order to determine presence of a "voltage leak" across fin groups that are a part of the electrode array(s) 114. In some examples, presence of corrosive crystal growth on the fin groups of electrode array(s) 114 results in the presence of a voltage (e.g., V>0) when crystal formation initiates shorting (e.g., closing of an open circuit allowing the fin group to conduct electricity). This data (e.g., output voltages) from the example sacrificial PCB 110 provides evidence of conductive crystal growth formation resulting from corrosion.

The data storage 122 can be used by the example server 118 to retrieve data associated with input and output voltage readings originating from the example multiplexer 112 and/or example controller 106. The data storage 122 may be implemented by any device for storing data such as, for example, flash memory, magnetic media, optical media, etc. Furthermore, the data stored in the example data storage 122 may be in any data format such as, for example, binary data, comma delimited data, tab delimited data, structured query language (SQL) structures, etc.

The server management bus (SMB) 124 allows for out-of-band server management (e.g., device management through out-of-band management performed via a network connection but physically separate from an in-band network connection that the system is serving, such as for purposes of improving channel security). In some examples, the bus 124 allows administrators to reboot the server 118, view event logs, and/or monitor one or more aspects of system performance (e.g., power, temperature, work load, memory, etc.). For example, the bus 124 can be an intelligent platform management interface (IPMI) bus or a baseboard management controller (BMC) bus (e.g., IPMI sub-system-based controller). In FIG. 1, the example main PCB 102 components (e.g., example sacrificial PCB 110, example controller 106, etc.) access the example bus 124. In some examples, the main PCB 102 components (e.g., example sacrificial PCB 110, example controller 106, etc.) are in communication with the server 118 via one or more wired and/or wireless networks represented by network 116.

Figure 2:
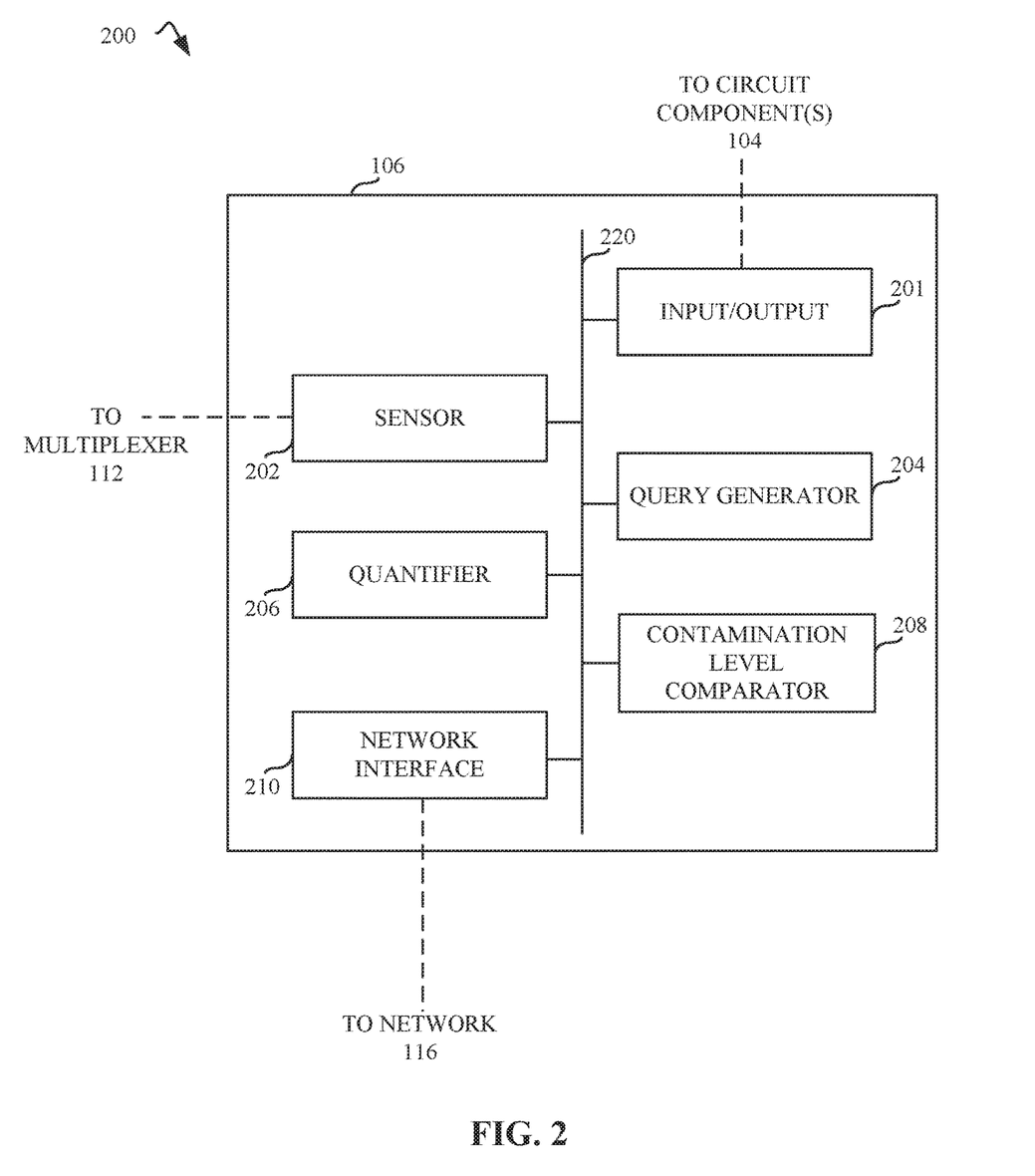
FIG. 2 is a block diagram of an example implementation of the controller of FIG. 1.

FIG. 2 is a block diagram 200 of an example implementation of the controller 106 of FIG. 1. The example controller 106 includes an example input/output 201, and example sensor 202, an example query generator 204, an example quantifier 206, an example contamination level comparator 208, and an example network interface 210, all of which are connected using an example bus 220. The input/output 201 allows for input/output of information between the circuit component(s) 104 and the rest of the controller 106 elements. The sensor 202 identifies voltage (e.g., output voltage ($V_{out}$)) from the example multiplexer 112 of FIG. 1. For example, the sensor 202 determines whether the example multiplexer 112 is generating voltage values based on input power (e.g., input voltage ($V_{in}$)). In some examples, a higher output voltage is detected relative to the input voltage when fin groups begin to conduct electricity as a result of conductive crystal formation, output voltage being higher at advanced stages of crystal formation. In some examples, a voltage threshold can be used to determine if the fin group is conducting as a result of crystal formation. In some examples, the sensor 202 receives the output voltage ($V_{out}$) generated as a result of a query initiated by the controller 106 to identify voltage leaks across one or more electrode fin group array(s) (e.g., example electrode array(s) 114 of FIG. 1). The sensor 202 allows the controller 106 to receive input from, and generate output to, the example sacrificial PCB 110 of FIG. 1. The controller 106 can be connected to one or more other circuit component(s) 104 of FIG. 1, thereby also receiving input from, and generating output to, the one or more example circuit component(s) 104.

The query generator 204 generates a query to the example multiplexer 112 of FIG. 1 to determine presence of "voltage leaks" (e.g., differences in input voltage and output voltage values) across fin groups that are part of the one or more example electrode array(s) 114 of FIG. 1. For example, the query generator 204 queries electrical values for each channel of the multiplexer 112. In some examples, each fin group of the electrode array(s) 114 is tested separately to determine corrosive exposure values for a select number of the one or more fin group(s) of the one or more electrode array(s) 114. In some examples, the query generator 204 can query all channels of the multiplexer 112 to determine corrosive exposure values using all available fin groups of the one or more electrode array(s) 114. To generate the query using the example query generator 204, the example controller 106 provides a base voltage or a nominal voltage to the example electrode array(s) 114. In some examples, an analog to digital conversion (ADC) voltage is used as a reference voltage, such that the ADC can use this highly accurate voltage internally to determine the input voltage. The example query generator 204 triggers the example multiplexer 112 to apply power to the one or more fin group(s) of the example electrode array(s) 114. In examples where conductive crystal formation has occurred on the one or more fin group(s) of the electrode array(s) 114, a voltage begins to register when the crystal has bridged the positive and negative traces of the fin group open circuit, thereby generating a voltage that serves as an output to the controller 106. In some examples, the query generator 204 therefore queries a select number of multiplexer 112 channels to determine whether voltage is registering on specific fin groups of the electrode array(s), given that a registered voltage on one group can indicate larger crystal formations than a registered voltage on another group (e.g., fin groups with varying distances between positive and negative traces register crystal formations at different times depending on the crystal formation size needed to bridge the negative and positive traces of the electrode fin group(s)).

The quantifier 206 determines differences between the input voltage and output voltage in the presence of a reference to a ground (GND). In some examples, the quantifier 206 determines a voltage differential in the absence of a voltage reference (e.g., using a Wheatstone bridge). In some examples, the quantifier 206 identifies the voltage generated for a specific fin group of the electrode array(s) 114. In some examples, the quantifier 206 identifies the voltage generated for a specific electrode array in a group of electrode arrays. This increases the level of flexibility in determining which one or more of the fin group(s) and/or electrode array(s) contributed to the "voltage leak" identified when corrosive crystal formation occurs on the example electrode array(s) 114 of the example sacrificial PCB 110. For example, if one or more sacrificial PCBs 110 cover a large area of the PCB 102, the controller 106 can determine, using the quantifier 206, one or more locations of the PCB 102 where crystal growth is predominant by querying, using the query generator 204, the one or more channels of the one or more multiplexer(s) 112.

The contamination level comparator 208 compiles the results generated by the example quantifier 206 to determine the level of contamination in a given area of the example PCB 102 of FIG. 1. For example, the level of contamination can be high, low, or moderate, depending on established thresholds. In some examples, the controller 106 and/or the management software 120 monitors the level of contamination over a period of time and compiles available data to determine any sudden changes in crystal formation (e.g., progressive corrosion monitoring). This is especially useful in environments where corrosion can occur gradually and can, in some examples, fluctuate based on environmental conditions (e.g., humidity, temperature, etc.). In some examples, the contamination level comparator 208 can trigger, via the controller 106 and/or the management software 120, an alert indicating a high level of contamination in order to prevent system malfunction and/or failure. In some examples, the data generated by the quantifier 206 and the contamination level comparator 208 is stored in the data storage 122 of FIG. 1. In some examples, the data generated by the controller 106 is received by the management software 120 operating on the server 118. In some examples, querying is initiated by management software 120.

The network interface 210 interfaces with the network 116 to transmit information between the controller 106 elements and the server 118 and/or management software 120. In some examples, the controller 106 receives instructions from the management software 120 via the network interface 210. For example, the management software 120 can be used to initiate a query of specific multiplexer 112 channels to determine changes in voltage at one or more electrode array(s) 114.

Figure 3:
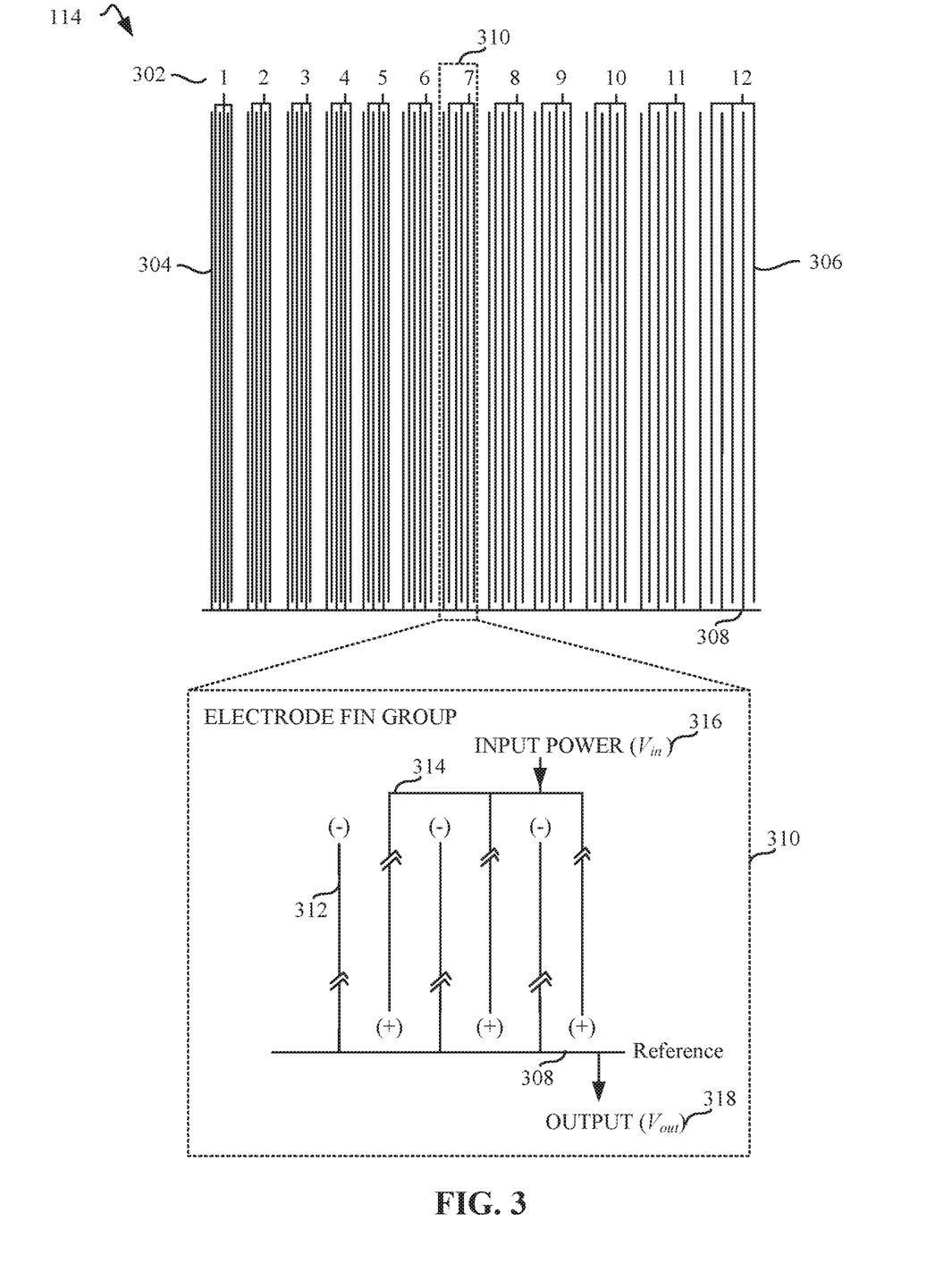
FIG. 3 is an illustration of example electrode fin groups for detecting corrosion with the example controller of FIG. 2.
Figure 4:
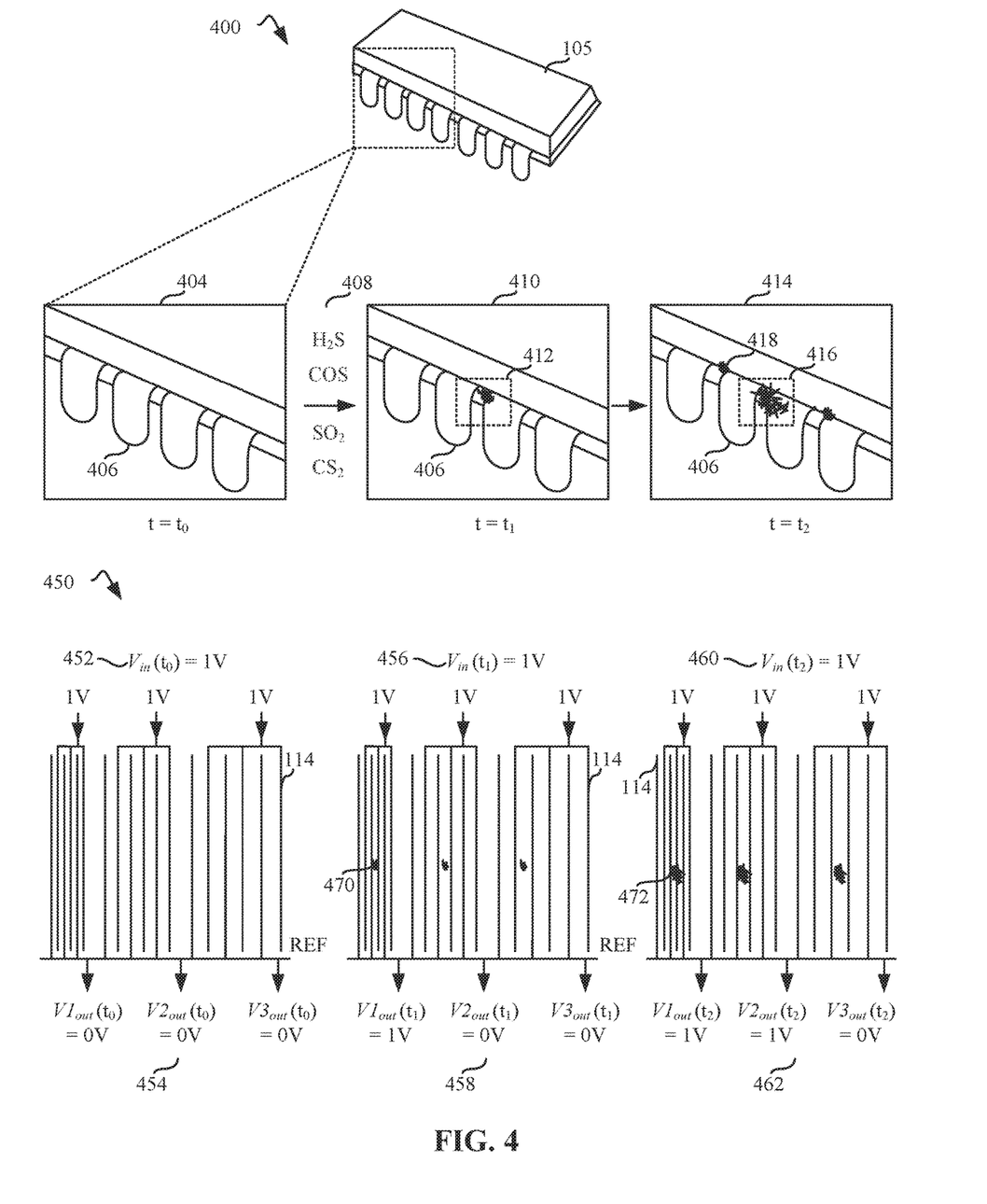
FIG. 4 is an illustration of example corrosive crystal formation over time on an electronic device and example detection of corrosive exposure values with the example system 100 of FIG. 1.

FIG. 3 is an illustration of example electrode fin groups of electrode array(s) 114 of FIG. 1 for detecting corrosion with example controller 106 of FIG. 2. In some examples, a set of electrode fin groups 302 (e.g., electrode fin groups 1-12) form a single electrode array positioned on the example sacrificial PCB 110. The electrode fin groups 302 include positive and negative traces that form an open circuit. The electrode fin groups can be designed to allow monitoring of progressive corrosion by including groups with smaller and greater inter-trace widths (e.g., electrode fin group 304 versus electrode fin group 306) such that bridging of the positive and negative traces (e.g., formation of a closed circuit) by a forming conductive crystal occurs at various time points depending on crystal size (e.g., fin group 1 traces would be bridged more quickly by a forming crystal compared to fin group 12 traces). In some examples, the fin groups 302 of the electrode array are connected to a reference 308 (e.g., ground). For example, FIG. 4 presents a representative electrode fin group 310 showing the positive traces 314 and the negative traces 312 used to form the fin group 310. In some examples, the positive and negative traces can be spaced apart between 0.1 mm-2 mm (e.g., inter-trace width range from 0.1 mm to 2 mm, 0.1 mm inter-trace widths for fin group 1 versus 2 mm inter-trace widths for fin group 12). The example fin group 310 is powered by an input voltage ($V_{in}$) 316 via the example multiplexer 112 from the example controller 106. For example, when the query generator 204 of FIG. 2 queries the multiplexer 112 channels, one of such channels lead to the fin group 310, which receives the input power 316. Since the example electrode fin group 310 is an open circuit (e.g., the positive trace(s) 314 and negative trace(s) 312 do not have a connection point without a conductive crystal growth that creates a bridge between the traces), the output voltage ($V_{out}$) 318 can be $V_{out}$=0V. In some examples, the output voltage ($V_{out}$) 318 can be received at the multiplexer 112 channel and obtained from the multiplexer 112 by the controller 106 as part of corrosive exposure value determination by the quantifier 206. To determine which electrode fin groups 302 are registering a voltage, the controller 106 can query each of the electrode fin groups 302 individually and/or selectively to determine an output voltage measurement resulting when each of the fin groups are powered by the controller 106 one at a time. The determination of voltage measurement is performed relative to a reference point 308 (e.g., ground).

FIG. 4 is an illustration 400 of example corrosive crystal formation over time on an electronic device and example detection 450 of corrosive exposure values with the example controller 106 of FIG. 2. In FIG. 4, an example circuit component 105 of FIG. 1 includes one or more pin(s) 406 that can be prone to corrosive crystal formation when exposed to high pollution environments (e.g., components with particular sensitivity to corrosion include edge connectors, pin connectors, wire-wrap connections, etc.). In the example frame 404 of FIG. 4, the pin(s) 406 are free of any corrosive build-up (e.g., absence of corrosive crystal formations at time (t) when the circuit component 105 has been placed in a highly polluted environment without any previous exposure to such an environment (at t=$t_0$)). Over the course of time (e.g., at t=$t_1$), the example circuit component 105 is exposed to air pollutants 408 (e.g., hydrogen sulfide ($H_2S$), carbonyl sulfide (COS), sulfur dioxide ($SO_2$), and carbon disulfate ($CS_2$)) that initiate the corrosive process on the surface of the example pin(s) 406 base metal, resulting in conductive crystal formation 412 (e.g., frame 410 of FIG. 4). The crystal formation 412 continues to grow in size to produce larger crystals 416 that can disrupt electrical current flow (e.g., disruption of a contact point) on the example PCB 102 due to crystal accumulations at electrical component 105 pin sites. After longer periods of time (e.g. t=$t_2$), the example electrical component 105 starts to show signs of accumulated crystal formations (e.g., crystal formations 416, 418) in other areas of the component 105 (e.g., frame 414 of FIG. 4). Other environmental factors (e.g., humidity, temperature, air flow, etc.) can contribute to the rate of crystal formation. Taking this into consideration, corrosive progression monitoring can reduce potential effects of airflow variation on crystal formations on the sensing surface (e.g., electrode array(s) 114 on sacrificial PCB 110) by placing the example sacrificial PCB 110 in an area of the example original PCB 102 where airflow is limited to prevent air pollutants from accumulating in select areas of the example PCB 102.

FIG. 4 includes example detection 450 of corrosive exposure values on an example electrode array 114 used for purposes of monitoring progressive corrosion. For example, detection can be performed using one or more of the electrode fin group(s) 302 of FIG. 3. At t=$t_0$, the example circuit component 105 is first exposed to a highly polluted environment, such that crystal formation is yet to begin. The example controller 106 queries, via the example query generator 204, one or more channels of the example multiplexer 112 of FIG. 1. In some examples, the controller 106 provides an input voltage 452 (e.g., $V_{in}(t_0)$=1V) to the multiplexer 112 which in turn acts as input power to the electrode fin groups. Given that no crystal formation is present on the electrode fin groups, the output voltage 454 is null (e.g., $V1_{out}(t_0)$=0V, $V2_{out}(t_0)$=0V, and $V3_{out}(t_0)$=0V at every electrode fin group of the array 114 queried) because the positive and negative traces have not been bridged by a corrosive crystal, thereby maintaining the open circuit which prevents the input voltage from registering at $V_{out}(t_0)$=0V. At t=$t_1$, crystal formation has ensued as a result of air pollutant 408 deposition onto the example sacrificial PCB 110, thereby also accumulating on the electrode fin group array 114. At shorter exposures to air pollutants 408, formed crystals 470 are able to bridge the positive and negative traces (e.g., positive 314 and negative 312 traces of FIG. 3) of electrode fin groups with smaller inter-trace widths (e.g., widths of 0.1 mm), but not traces of electrode fin groups with larger inter-trace widths (e.g., widths of 2 mm). As such, at t=$t_1$ crystal formation 470 causes a closed circuit on the first electrode fin group but not on the second or third electrode fin groups, resulting in an output voltage 458 (e.g., $V1_{out}(t)$=1V for an input voltage 456 of $V_{in}(t_1)$=1V at the first electrode fin group). At the same time, $V2_{out}(t_1)$=0V and $V3_{out}(t)$=0V when each of the second and third electrode fin groups are powered because the second and third fin groups do not have any conductive crystal formation that bridges the traces.

At t=$t_2$, crystal formation 470 has advanced such that the larger crystals 472 can now bridge the positive and negative traces of the second electrode fin group as well as the first electrode fin group, but are still too small to bridge the traces of the third electrode fin group. As a result, the output voltage 462 at the first fin group remains the same (e.g., $V1_{out}(t_2)$=1V) and increases for the second fin group ($V2_{out}(t_2)$=1V) from the output voltage 458. The third fin group electrode array does not show voltage when powered by the controller 106 e.g., $V3_{out}(t_2)$=0V) because the crystal formation 472 is not larger enough to bridge the inter-trace gap. The example controller 106 can query the example multiplexer 112 channels over time to determine changes in the output voltage indicating increased crystal growth on the one or more example electrode array(s) 114.

Figure 5:
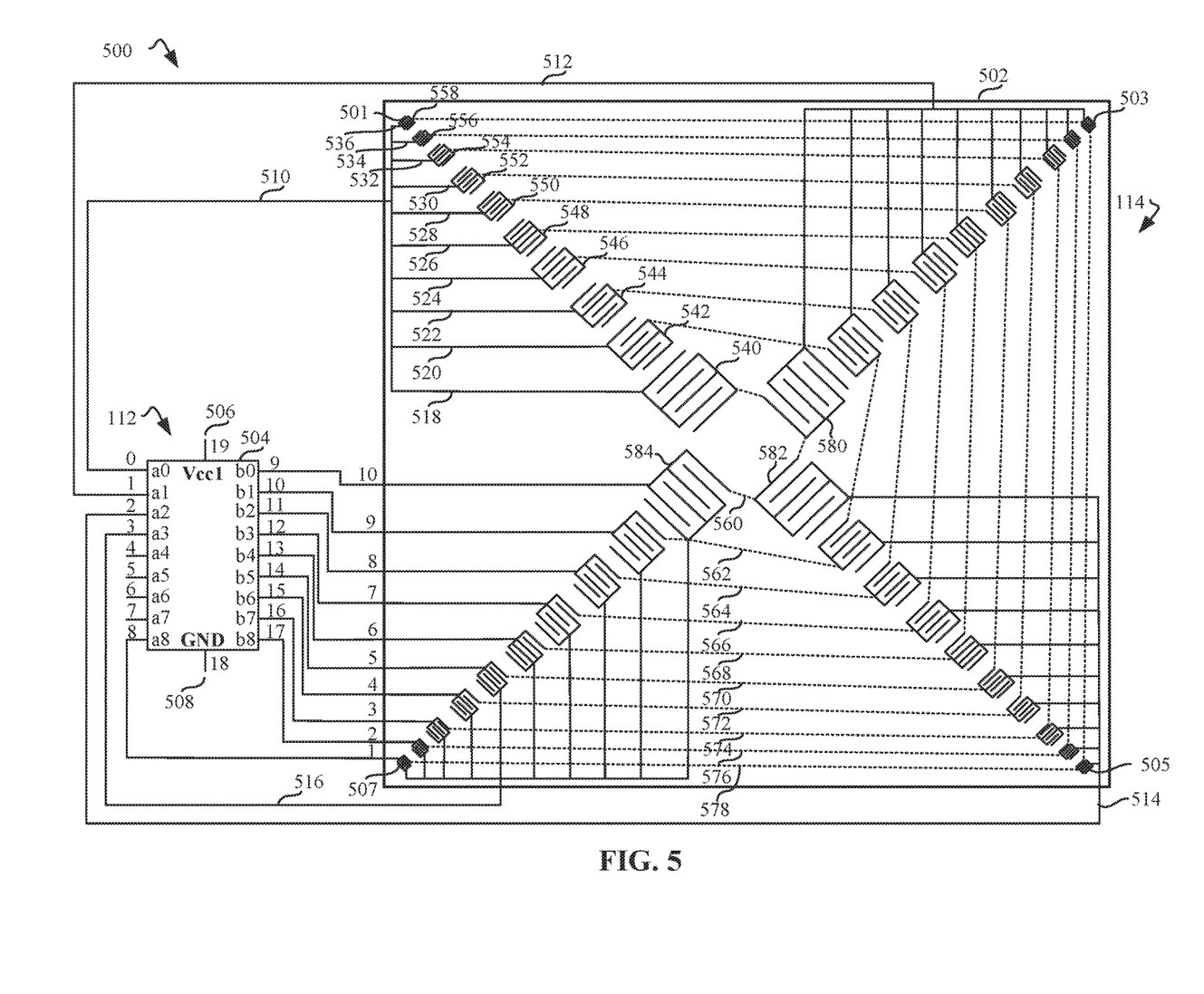
FIG. 5 is an illustration of example electrode fin group arrays 114 for detection of corrosive crystal formation on an electronic device with the example system of FIG. 1.

FIG. 5 is an illustration 500 of example electrode fin group arrays 114 for detection of corrosive crystal formation on an electronic device 101 with the example controller 106 of FIG. 2 via the example multiplexer 112 of FIG. 1. In some examples, multiple electrode arrays can be used for the purpose of detecting progressive corrosion (e.g., multiple electrode arrays queried to determine level of corrosion progression). The use of multiple electrodes increases the specificity of identifying particular areas of the example PCB 102 where corrosive crystal formation occurs (e.g., example controller 106 can query a greater number of channels at the example multiplexer 112 that are connected to several electrode arrays on the example PCB 102, thereby obtaining a greater amount of data). In the example of FIG. 5, the sacrificial PCB area 502 includes 4 sets of electrode arrays (e.g., arrays 501, 503, 505, and 507) which include electrode fin groups with varying positive and negative trace widths similar to the example fin groups of FIG. 3-4. The example multiplexer 504 of FIG. 5 (e.g., 18-to-1 multiplexer) includes a pin 506 for receiving input voltage ($V_{in}$) from the example controller 106 and a pin 508 which serves as the reference or ground. In some examples, the multiplexer 504 passes the input voltage ($V_{in}$) to one or more of the electrode array(s) 501, 503, 505, and 507. For example, the multiplexer 504 passes the input voltage $V_{in}$, from a0, a1, a2, and/or a3 along connections 510, 512, 514, and/or 516 to one or more of the electrode array(s) 501, 503, 505, and/or 507, respectively. The $V_{in}$ can pass through the example one or more connection(s) 510, 512, 514, and 516 and branch out to each of the electrode fin groups in the electrode array. For example, a $V_{in}$ originating from a0 of the multiplexer 504 passes along connection 510 and branches out along connections 518, 520, 522, 524, 526, 528, 530, 532, 534, and 536 to provide the $V_{in}$ to electrode fin groups 540, 542, 544, 546, 548, 550, 552, 554, 556, and 558 of electrode array 501, respectively. If none of the electrode fin groups 540-558 have conductive crystal growths that bridge any one of the open circuits formed by the positive and negative traces of the electrode array 501, the output voltage $V_{out}$ originating from any one of the electrode fin groups 540-558 will remain at 0V. In some examples, the multiplexer 504 provides the $V_{in}$ to one electrode array (e.g., electrode array 501) without any of the other electrode arrays 503, 505, and 507 receiving a $V_{in}$ via connections 512, 514, and 516. In some examples, connections 560, 562, 564, 566, 568, 570, 572, 574, 576, and 578 (e.g., dotted lines in FIG. 5) link electrode fin groups with similar inter-trace widths (e.g., electrode fin groups 540, 580, 582, and 584 are linked via connection 560). For example, if electrode fin group 540 has conductive crystal formations that bridge its positive and negative traces, the $V_{in}$ (e.g., $V_{in\_540}$=1V) from connection 518 results in an output voltage $V_{out}$ greater than 0V (e.g., $V_{out\_540}$=1V). The output voltage ($V_{out\_540}$) then acts as an input voltage to the next similarly-sized electrode fin group 680 (e.g., $V_{in\_580}$=1V).

In some examples, the path of connection 560 from electrode fin group 540 to electrode fin group 580 to electrode fin group 582 and subsequently to electrode fin group 584 results in a closed circuit, providing a final output of $V_{out}$=1V to the multiplexer 504 at b0 if $V_{out\_540}$=1V. This allows the example controller 106 to query a specific electrode array (e.g., electrode array 501) to determine which of the fin groups 540-558 have closed circuits as a result of crystal growths that bridge the fin group traces. For example, the controller 106 can query channels b0 thru b8 and a8 to obtain an output voltage from each fin group of electrode array 501 (e.g., electrode fin groups 540 thru fin groups 558) if the electrode array 501 receives an input voltage (e.g., input power). In the example of FIG. 5, output voltage from fin group 558 is received at a8 of the multiplexer 112 along the outer connection 578, while any one or more of the multiplexer 112 pins a4, a5, a6, and/or a7 can connect to the example controller 106 to provide the final output voltage as a result of the example controller 106 initiating a query (e.g., via example query generator 204 of FIG. 2) to any one or more of the multiplexer channel(s) (e.g., b0-b8 and a8). In some examples, one or more electrode array(s) 501, 503, 505, and/or 507 can be powered at once. In some examples, one or more of the example sacrificial PCB areas 502 of FIG. 5 can be included throughout the example PCB 102 of FIG. 1 for purposes of monitoring progressive corrosion of circuit components.

Providing an input voltage to the one or more multiplexer 112 channel(s) used to power the electrode array(s) 114 allows for a voltage change to be detected by the example controller 106 when comparing the input voltage to the output voltage. For example, detecting a "voltage leak" across the one or more fin group(s) of the electrode array(s) 114 is possible by having a known input voltage value (e.g., regulated base voltage serving as a reference voltage provided by an analog to digital converter (ADC)) against which the output voltage value is compared (e.g., $\Delta V$ representing the "voltage leak" resulting from conductive crystal bridging of fin group traces). In some examples, the differential voltage can be observed using a Wheatstone bridge (e.g., electrical circuit used to measure an unknown electrical resistance without the need for an accurate voltage reference). In some examples, given that resistor values have a tolerance, a resistor divider (e.g., voltage divider) can be used to hold resistor ratios more accurately than absolute values. For example, the detection circuit (e.g., an electrode array) can be strapped across one side of a resistor divider, with an ADC used to measure the voltage, such that the voltage would be altered when the detection circuit starts conducting (e.g., negative and positive traces bridged by conductive crystal formation). In some examples, the resistor divider (e.g., voltage divider) can move into the ADC once volumes reach a threshold (e.g., ADC with a resistor divider used as part of a switch voltage ladder).

In some examples, one or more of the electrode array(s) 501, 503, 505, and/or 507 can be made of one or more different metals (e.g., aluminum, tin, silver, etc.) in order to examine how particular environmental conditions (e.g., highly polluted air, humidity levels, air flow, etc.) can affect such materials given that electronic devices can be produced using a variety of different metals that can react differently to the same environmental conditions. For example, the electrode arrays 501, 503, 505, and/or 507 can vary in their material composition such that one or more of the array(s) is one type of metal (e.g., aluminum) and another array is another type of metal (e.g., silver). In some examples, the sacrificial PCB 110 having one or more electrode array(s) 114 can be positioned such that the sacrificial PCB 110 is vertical instead of horizontal with respect to the example original PCB 102. In some examples, the sacrificial PCB 110 can be mounted horizontally such that any dust that is conductive can be captured, given that settling of conductive dust can also contribute to premature failure of electronic component assemblies.

While an example manner of implementing the example controller 106 is illustrated in FIG. 2, one or more of the elements, processes and/or devices illustrated in FIG. 2 may be combined, divided, re-arranged, omitted, eliminated and/or implemented in any other way. Further, the example input/output 201, the example sensor 202, the example query generator 204, the example quantifier 206, the example contamination level comparator 208, the example network interface 210 and/or, more generally, the example controller 106 of FIG. 2, and/or the example multiplexer 112 and the example electrode array(s) 114 of FIG. 1 may be implemented by hardware, software, firmware and/or any combination of hardware, software and/or firmware. Thus, for example, any of the example input/output 201, the example sensor 202, the example query generator 204, the example quantifier 206, the example contamination level comparator, the example network interface 210 and/or, more generally, the example controller 106 of FIG. 2, and/or the example multiplexer 112 and/or the example electrode array(s) 114 of FIG. 1 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example input/output 201, the example sensor 202, the example query generator 204, the example quantifier 206, the example contamination level comparator, the example network interface 210 and/or, more generally, the example controller 106 of FIG. 2, and/or the example multiplexer 112 and/or the example electrode array(s) 114 of FIG. 1 is/are hereby expressly defined to include a non-transitory computer readable storage device or storage disk such as a memory, a digital versatile disk (DVD), a compact disk (CD), a Blu-ray disk, etc. including the software and/or firmware. Further still, the example controller of FIG. 1 and/or the example multiplexer 112 and/or the example electrode array(s) of FIG. 1 may include one or more elements, processes and/or devices in addition to, or instead of, those illustrated in FIGS. 1 and/or 2, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 6:
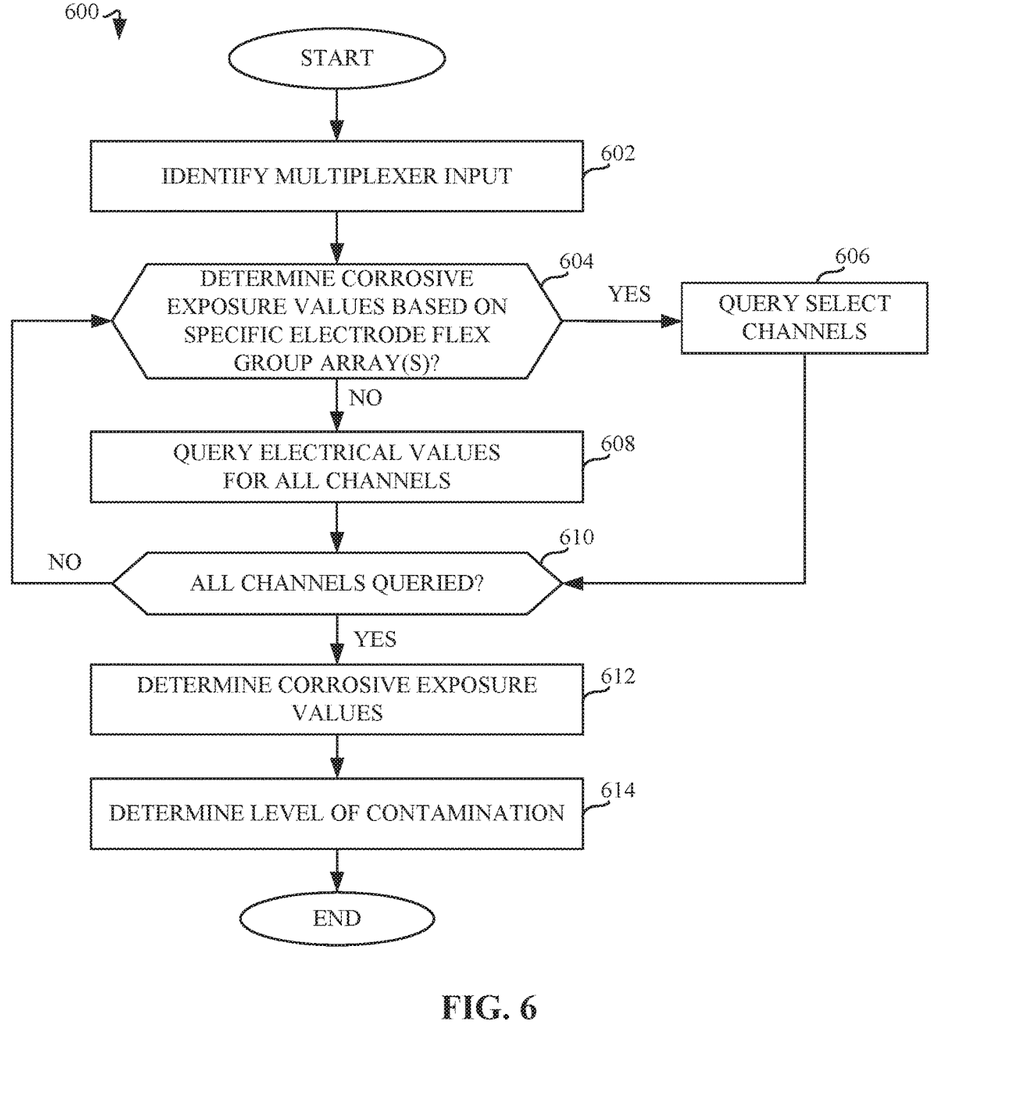
FIG. 6 is a flowchart representative of example machine readable instructions which may be executed to implement the example controller of FIG. 2 to detect corrosion within an electronic device.

A flowchart representative of example hardware logic, machine readable instructions, hardware implemented state machines, and/or any combination thereof for implementing the example controller 106 of FIG. 2 and/or the example multiplexer 112 of FIG. 1 and/or the example electrode array(s) 114 of FIG. 1 is shown in FIG. 6. The machine readable instructions may be one or more executable programs or portion(s) of an executable program for execution by a computer processor such as the processor 706 shown in the example processor platform 700 discussed below in connection with FIG. 7. The program may be embodied in software stored on a non-transitory computer readable storage medium such as a CD-ROM, a floppy disk, a hard drive, a DVD, a Blu-ray disk, or a memory associated with the processor 706, but the entire program and/or parts thereof could alternatively be executed by a device other than the processor 706, and/or embodied in firmware or dedicated hardware. Further, although the example program is described with reference to the flowchart illustrated in FIG. 6, many other methods of implementing the example controller 106, and/or the example multiplexer 112, and/or the example electrode array(s) 114 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a compiled format, an executable format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, compilation, etc. in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein.

In another example, the machine readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, the disclosed machine readable instructions and/or corresponding program(s) are intended to encompass such machine readable instructions and/or program(s) regardless of the particular format or state of the machine readable instructions and/or program(s) when stored or otherwise at rest or in transit.

As mentioned above, the example process of FIG. 6 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

FIG. 6 is a flowchart 600 representative of machine readable instructions which may be executed to implement elements of the example controller 106 of FIG. 2 to detect corrosion within an electronic device 101. In FIG. 6, the example sensor 202 identifies input (e.g., input voltage ($V_{in}$)) from the multiplexer to the example controller 106, given that the example controller 106 can receive a variety of inputs from one or more other example circuit component(s) 104 (block 602). The example controller 106 can determine final corrosion values based on one or more electrode flex group array(s) (e.g., example electrode array(s) 114 of FIG. 1), or the entire set of available flex group arrays on one or more example sacrificial PCBs 110 of FIG. 1 (block 604). A decision to query, using the example query generator 204, select channels of the example multiplexer 112 (block 606) versus querying each channel of the example multiplexer 112 (block 608) can be based on, for example, how the controller is pre-programmed and/or input from a user and/or instructions from example management software 120 of FIG. 1. In some examples, the query generator 204 queries electrical values for each channel (block 608) at designated time intervals over the entire length of the progressive corrosion monitoring process using the sacrificial PCB 110. The query generator 204 determines whether all channels have been queried (e.g., all designed channels for querying, whether selective channels of the example multiplexer 112 or each channel) (block 610). For example, the query generator 204 provides an input voltage ($V_{in}$) to the multiplexer 112 to permit the multiplexer 112 to power one or more electrode fin group(s) of the one or more electrode array(s) 114. For example, if the query generator 204 queries all channels of a multiplexer 112 to obtain an output voltage ($V_{out}$) reading for each electrode fin group and/or electrode array 114, the multiplexer 112 selectively and/or individually powers channels connected to the fin group(s) and/or electrode array(s) to obtain $V_{out}$ readings used to determine the voltage generated for each channel. For example, a conductive crystal growth that bridges the positive and negative traces of an electrode fin group closes the otherwise open circuit created by the presence of one or more non-touching electrode traces. The closed circuit allows the input voltage ($V_{in}$) to pass and return to the example multiplexer 112, providing an output voltage ($V_{out}$). For example, if $V_{in}$=1V input to an electrode fin group, the absence of conductive crystal formation retains the open-circuit nature of the electrode fin group, thereby resulting in output of $V_{out}$=0V, which is received by the example multiplexer 112 at the multiplexer channel connected to that electrode fin group as a result of the query by the example query generator 204. If, however, there exists a conductive crystal formation at the electrode fin group that bridges the positive and negative traces of the electrode (e.g., forming a closed circuit and/or a short circuit), the input voltage $V_{in}$=1V to the electrode fin group results in an output voltage of $V_{out}$=1V. As such, multiple electrode fin groups presenting with conductive crystal formation will result in a higher output voltage (e.g., $V_{out}$>1V).

The example quantifier 206 of FIG. 2 determines corrosive exposure values (block 612) using the one or more output voltage(s) $V_{out}$ received from the example multiplexer 112 based on the multiplexer channels queried (blocks 606 and 608). For example, the quantifier 206 compares the output voltages $V_{out}$ from one or more fin group(s) and/or one or more electrode array group(s) in order to determine corrosive exposure values for each set of fin groups and/or electrode arrays. In some examples, the quantifier 206 determines whether fin groups with smaller inter-trace widths (e.g., widths between the negative and positive traces of the fin group) are showing a output voltage $V_{out}$>0V when compared to fin groups with greater inter-trace widths. For example, the quantifier 206 compares changes in voltage over time to determine significant changes in the corrosive exposure values.

The example contamination level comparator 208 determines the level of contamination using corrosive exposure values determined by the example quantifier 206 (block 614). In some examples, the contamination level comparator 208 determines the level of contamination of the PCB 102 by comparing the output voltages $V_{out}$ for the one or more electrode fin group(s) and/or the one or more electrode array(s) to given thresholds that correspond to contamination levels (e.g., high, low, or moderate contamination). In some examples, these thresholds can be generated by correlating output voltage values with stages of conductive crystal formation on the electrode array(s) 114 during progressive corrosion in high pollution environments. In some examples, the contamination level comparator 208 identifies areas of the PCB 102 where higher levels of corrosive crystal formation are detected, based on the location of the sacrificial PCB 110 relative to the PCB 102 components. For example, presence of multiple electrode arrays on sacrificial PCBs 110 located throughout the original PCB 102 allows the controller 106 to query multiple electrode arrays based on specific areas of the PCB 102 via the one or more multiplexer(s) 112 to determine if there is variation in corrosive exposure based on location. In some examples, the sacrificial PCB 110 with electrode array(s) 114 can be used to monitor progressive corrosion in areas adjacent to one or more circuit component(s) 104. For example, the sacrificial PCB 110 can be positioned such that electrode fin groups with specific inter-trace widths are positioned more closely to a given circuit component (e.g., electrode fin groups with specific inter-trace widths corresponding to the crystal size formation on an electrical component that would be indicative of impending electrical component failure and/or malfunction could be positioned more closely to a given circuit component as opposed to positioning fin groups with inter-trace widths that would be bridged by smaller crystal micro-growths having negligible effects on an electronic assembly component). In some examples, the contamination level comparator 208 initiates an alarm or generates an indicator that informs a user of the contamination level in a given unit being monitored for signs of progressive corrosion.

Figure 7:
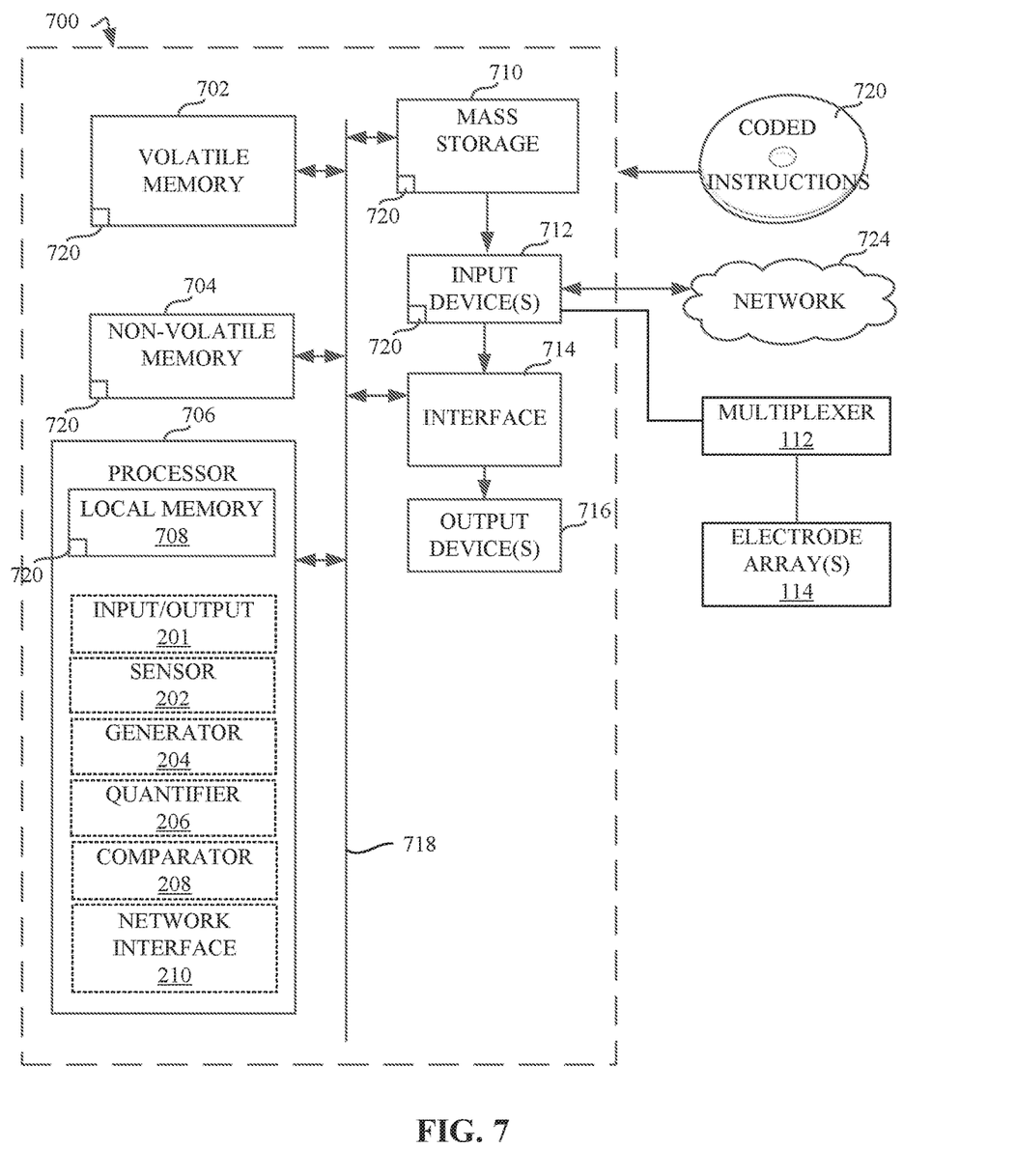
FIG. 7 is a block diagram of an example processing platform structured to execute the instructions of FIG. 6 to implement the example controller of FIGS. 1 and/or 2.

FIG. 7 is a block diagram of an example processing platform 700 structured to execute the instructions of FIG. 6 to implement the example controller 106 of FIGS. 1 and/or 2. The processor platform 700 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, or any other type of computing device.

The processor platform 700 of the illustrated example includes a processor 706. The processor 706 of the illustrated example is hardware. For example, the processor 706 can be implemented by one or more integrated circuits, logic circuits, microprocessors, GPUs, DSPs, or controllers from any desired family or manufacturer. The hardware processor may be a semiconductor based (e.g., silicon-based) device. In this example, the processor implements the example input/output 201, the example sensor 202, the example generator 204, the example quantifier 206, the example comparator 208, the example network interface 210 and/or, more generally, the example controller of FIG. 2.

The processor 706 of the illustrated example includes a local memory 708 (e.g., a cache). The processor 706 of the illustrated example is in communication with a main memory including a volatile memory 702 and a non-volatile memory 704 via a bus 718. The volatile memory 702 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 704 may be implemented by flash memory and/or any other desired type of memory device. Access to the main memory 702, 704 is controlled by a memory controller.

The processor platform 700 of the illustrated example also includes an interface circuit 714. The interface circuit 714 may be implemented by any type of interface standard, such as an Ethernet interface, a universal serial bus (USB), a Bluetooth® interface, a near field communication (NFC) interface, and/or a PCI express interface.

In the illustrated example, one or more input devices 712 are connected to the interface circuit 714. The input device(s) 712 permit(s) a user to enter data and/or commands into the processor 706. The input device(s) can be implemented by, for example, an audio sensor, a microphone, a camera (still or video), a keyboard, a button, a mouse, a touchscreen, a track-pad, a trackball, isopoint and/or a voice recognition system. The input device(s) 712 are also connected to the example multiplexer 112 of FIG. 1, and the example electrode array(s) 114 of FIG. 1 via the multiplexer 112.

One or more output devices 716 are also connected to the interface circuit 714 of the illustrated example. The output devices 716 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 714 of the illustrated example, thus, typically includes a graphics driver card, a graphics driver chip and/or a graphics driver processor.

The interface circuit 714 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 724. The communication can be via, for example, an Ethernet connection, a digital subscriber line (DSL) connection, a telephone line connection, a coaxial cable system, a satellite system, a line-of-site wireless system, a cellular telephone system, etc.

The processor platform 700 of the illustrated example also includes one or more mass storage devices 710 for storing software and/or data. Examples of such mass storage devices 710 include floppy disk drives, hard drive disks, compact disk drives, Blu-ray disk drives, redundant array of independent disks (RAID) systems, and digital versatile disk (DVD) drives.

The machine executable instructions 720 of FIG. 3 may be stored in the mass storage device 710, in the volatile memory 702, in the non-volatile memory 704, and/or on a removable non-transitory computer readable storage medium such as a CD or DVD.

From the foregoing, it will be appreciated that example systems, methods, and apparatus allow for improved detection of corrosion. Examples disclosed herein permit evaluation of corrosive exposure values on each electronic assembly unit individually. In examples disclosed herein, electrode fin groups are implemented to track the progression of conductive crystal growths resulting from corrosion processes. Furthermore, examples disclosed herein allow for a variety of electrode-based corrosion detection approaches based on the total area of interest for corrosion monitoring purposes. In examples disclosed herein, a level of electronic assembly contamination can be determined by querying channels with access to the electrode fin groups to obtain and compare changes in input voltage and output voltage over time (e.g., contamination determined at specified time intervals depending on data collection frequency) As such, determination of a voltage across the electrode fin groups can be used to obtain corrosive exposure values. In examples disclosed herein, electrode fin group traces have varying distances to accommodate detection of early-stage versus late-stage corrosive crystal formation. In examples disclosed herein, the electrode fin arrays can be a part of a sacrificial printed circuit board (PCB). Furthermore, in some examples disclosed herein, the sacrificial PCB can be a replaceable unit that can be positioned on the original PCB where detection of corrosive crystal formation is of interest.

In some examples disclosed herein, testing the reaction of various metals (e.g., metal content including aluminum, tin, silver, etc.) to the environment of electronic assembly components can be performed by varying the electrode fin group metal composition. Examples disclosed herein further allow for electrode assembly corrosion monitoring in mission critical infrastructure, where failure would result in critical outages. For example, the apparatus and systems disclosed herein can be used in cell tower systems located in heavily populated urban centers that are prone to high pollution and corrosive deposits on electronic gear is commonplace. Examples disclosed herein introduce a low-cost approach to monitoring corrosion in electronic assemblies. Furthermore, examples disclosed herein allow validation of environments in which warranty claims are filed by detecting the corrosive nature of a given electronic assembly.

Disclosed herein are example systems, apparatus, and methods for improved detection of corrosion. Example 1 includes an apparatus for corrosion detection on electronic component assemblies, comprising a query generator to query a multiplexer channel to receive an output voltage, the multiplexer channel linked to a fin group of an electrode array, the fin group forming an open circuit in the absence of conductive crystal formation, a quantifier to determine, using a reference voltage, a difference between the reference voltage and the output voltage from the queried multiplexer channel, and a contamination level comparator to identify presence of conductive crystal formation based on the difference between the reference voltage and the output voltage.

Example 2 includes the apparatus of Example 1, further including a sensor to identify the output voltage from the multiplexer channel, the output voltage obtained from the electrode array connected to the multiplexer channel.

Example 3 includes the apparatus of Example 1, wherein the open circuit of the fin group includes a positive trace and a negative trace, the positive trace and the negative trace bridged by conductive crystal formation to create a closed circuit.

Example 4 includes the apparatus of Example 3, wherein the positioning of the positive trace and the negative trace forms an inter-trace width, the inter-trace width decreased to detect smaller conductive crystal formations, the inter-trace width increased to detect larger conductive crystal formations.

Example 5 includes the apparatus of Example 4, wherein the inter-trace width range is from example 0 includes 1 mm to 2 mm.

Example 6 includes the apparatus of Example 1, wherein conductive crystal formation is directly proportional to the output voltage, a greater amount of conductive crystal formation resulting in a higher cumulative output voltage, the cumulative voltage a sum of the output voltages generated for two or more electrode fins.

Example 7 includes the apparatus of Example 1, wherein electrode flex groups form one or more electrode arrays used to determine corrosive exposure values on one or more areas of a first printed circuit board.

Example 8 includes the apparatus of Example 7, wherein the multiplexer and the electrode fin group are incorporated into a second printed circuit board, the second printed circuit board a sacrificial printed circuit board, the sacrificial printed circuit board positioned on one or more regions of the first printed circuit board.

Example 9 includes the apparatus of Example 8, wherein the second printed circuit board is positioned vertically with respect to the first printed circuit board.

Example 10 includes the apparatus of Example 9, wherein the second printed circuit board includes a Wheatstone bridge.

Example 11 includes the apparatus of Example 8, wherein the first printed circuit board is a server board or an Internet of Things (IoT) board.

Example 12 includes the apparatus of Example 8, wherein the second printed circuit board accesses a server management bus or an intelligent platform management interface (IPMI) bus.

Example 13 includes the apparatus of Example 8, wherein the second printed circuit board is a replaceable unit, the second printed circuit board positioned on a header connected to a server motherboard, wherein the server motherboard is the first printed circuit board.

Example 14 includes the apparatus of Example 1, wherein a metal content of the electrode array includes aluminum, tin, or silver.

Example 15 includes the apparatus of Example 1, wherein the query generator provides a base voltage as input to the multiplexer, the base voltage provided using an analog to digital converter.

Example 16 includes the apparatus of Example 1, wherein the query generator receives a differential voltage measured using a Wheatstone bridge.

Example 17 includes the apparatus of Example 16, wherein the differential voltage is determined by positioning the electrode array across a first portion of a resistor divider, a change in the differential voltage identified by a sensor when the electrode array begins to conduct electricity, the electrode array to conduct electricity when conductive crystal formation is present on a fin group of the electrode array.

Example 18 includes a method for corrosion detection on electronic component assemblies, the method comprising querying a multiplexer channel to receive an output voltage, the multiplexer channel linked to a fin group of an electrode array, the fin group forming an open circuit in the absence of conductive crystal formation, determining, using a reference voltage, a difference between the reference voltage and the output voltage from the queried multiplexer channel, and identifying presence of conductive crystal formation based on the difference between the reference voltage and the output voltage.

Example 19 includes the method of Example 18, further including identifying the output voltage from the multiplexer channel, the output voltage obtained from the electrode array linked to the multiplexer channel.

Example 20 includes the method of Example 18, wherein querying includes providing an input voltage, the input voltage used as a base voltage to power the fin group.

Example 21 includes the method of Example 18, wherein querying includes determining a differential voltage using a Wheatstone bridge.

Example 22 includes the method of Example 18, further including a first printed circuit board positioned on a second printed circuit board, the second printed circuit board a sacrificial printed circuit board including the multiplexer and the electrode array, the second printed circuit board positioned vertically or horizontally relative to the first printed circuit board.

Example 23 includes the method of Example 22, wherein the second printed circuit board positioned vertically is used to capture conductive dust settling on the first printed circuit board.

Example 24 includes the method of Example 22, wherein identifying presence of conductive crystal formation includes determining a level of contamination on one or more electrode arrays positioned in one or more areas of the first printed circuit board, the level of contamination determined at specified time intervals.

Example 25 includes the method of Example 18, wherein querying includes querying multiple electrode arrays, the multiple electrode arrays queried one at a time, the querying initiated by powering a first electrode array to determine the output voltage for each of the electrode fin groups.

Example 26 includes the method of Example 18, wherein identifying presence of conductive crystal formation includes identifying conductive crystal formation resulting in a bridging of a positive trace and a negative trace of the fin group, the bridging of the positive trace and the negative trace by the conductive crystal formation resulting in a closed circuit on the fin group.

Example 27 includes the method of Example 18, wherein querying is initiated by a baseboard management controller.

Example 28 includes the method of Example 18, wherein querying is initiated by management software running on a server.

Example 29 includes a non-transitory computer readable storage medium comprising computer readable instructions that, when executed, cause one or more processors to, at least query a multiplexer channel to receive an output voltage, the multiplexer channel linked to a fin group of an electrode array, the fin group forming an open circuit in the absence of conductive crystal formation, determine, using a reference voltage, a difference between the reference voltage and the output voltage from the queried multiplexer channel, and identify presence of conductive crystal formation based on the difference between the reference voltage and the output voltage.

Example 30 includes the storage medium of Example 29, wherein the instructions, when executed, further cause the one or more processors to provide an input voltage, the input voltage used as a base voltage to power the fin group.

Example 31 includes the storage medium of Example 30, wherein the instructions, when executed, further cause the one or more processors to compare the output voltage of the fin group to the base voltage powering the fin group.

Example 32 includes the storage medium of Example 29, wherein the instructions, when executed, further cause the one or more processors to determine a differential voltage using a Wheatstone bridge.

Example 33 includes the storage medium of Example 29, wherein the instructions, when executed, further cause the one or more processors to determine a level of contamination on one or more electrode arrays positioned in one or more areas of a printed circuit board, the level of contamination determined over a period of time.

Example 34 includes the storage medium of example 29, wherein the instructions, when executed, further cause the one or more processors to query multiple electrode arrays, the querying initiated by powering a first electrode array to determine the output voltage for each of the electrode fin groups.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A method to detect corrosion on electronic component assemblies, the method comprising:
   determining a difference between a reference voltage and an output voltage from a multiplexer, the multiplexer is in circuit with a fin group of an electrode flex group, the electrode flex group including a first electrode array and a second electrode array, the first electrode array including a first metal and the second electrode array including a second metal, the second metal is different from the first metal; and
   identifying presence of conductive crystal formation on the electrode flex group based on the difference between the reference voltage and the output voltage.

2. The method of claim 1, further including identifying the output voltage from the multiplexer, the output voltage obtained from the electrode array linked to the multiplexer.

3. The method of claim 1, further including providing an input voltage, the input voltage used as a base voltage to power the fin group.

4. The method of claim 1, further including determining a differential voltage using a Wheatstone bridge.

5. The method of claim 1, further including a first printed circuit board positioned on a second printed circuit board, the second printed circuit board is a sacrificial printed circuit board including the multiplexer and the electrode flex group, the second printed circuit board positioned vertically or horizontally relative to the first printed circuit board; and further including capturing conductive dust with the second circuit board.

6. The method of claim 5, wherein the identifying the presence of the conductive crystal formation includes determining a level of contamination on one or more electrode arrays in one or more areas of the first printed circuit board, the level of contamination determined at specified time intervals.

7. The method of claim 1, further including querying multiple electrode arrays, the multiple electrode arrays queried one at a time, the querying initiated by powering a first electrode array to determine the output voltage for each of the electrode fin groups.

8. The method of claim 1, wherein the identifying the presence of the conductive crystal formation includes identifying the conductive crystal formation resulting in a bridging of a positive trace and a negative trace of the fin group, the bridging of the positive trace and the negative trace by the conductive crystal formation resulting in a closed circuit on the fin group.

9. The method of claim 7, wherein the querying is initiated by a baseboard management controller.

10. The method of claim 7, wherein the querying is initiated by management software running on a server.

11. A non-transitory computer readable storage medium comprising computer readable instructions that, when executed, cause one or more processors to, at least:
    determine a difference between a reference voltage and an output voltage from a multiplexer, the multiplexer is in circuit with a fin group of an electrode flex group, the electrode flex group including a first electrode array and a second electrode array, the first electrode array including a first metal and the second electrode array including a second metal, the second metal is different from the first metal; and
    identify presence of conductive crystal formation on the electrode flex group based on the difference between the reference voltage and the output voltage.

12. The storage medium of claim 11, wherein the instructions, when executed, further cause the one or more processors to provide an input voltage, the input voltage to be used as a base voltage to power the fin group.

13. The storage medium of claim 12, wherein the instructions, when executed, further cause the one or more processors to compare the output voltage of the fin group to the base voltage powering the fin group.

14. An apparatus to detect corrosion on electronic component assemblies, the apparatus comprising:
    an electrode flex group including:
      a first electrode array having a fin group, the fin group having an open circuit configuration and a closed circuit configuration, the configuration of the fin group depending on a presence of a conductive crystal formation, the fin group in the open circuit configuration in an absence of the conductive crystal formation, the first electrode array including a first metal; and
      a second electrode array including a second metal, the second metal is different from the first metal;
    a multiplexer is in circuit with the fin group;
    quantifier circuitry to determine a difference between a reference voltage and an output voltage from the multiplexer; and a contamination level comparator to identify the presence of the conductive crystal formation based on the difference between the reference voltage and the output voltage.

15. The apparatus of claim 14, further including a sensor to identify the output voltage from the multiplexer, the output voltage obtained from the first electrode array.

16. The apparatus of claim 14, wherein the fin group includes a positive trace and a negative trace, the positive trace and the negative trace to create the closed circuit when bridged by the conductive crystal formation.

17. The apparatus of claim 16, wherein the positive trace and the negative trace collectively exhibit an inter-trace width corresponding to a width of the conductive crystal formation.

18. The apparatus of claim 14, wherein the output voltage is directly proportional to the conductive crystal formation, a greater amount of the conductive crystal formation resulting in an increased output voltage for the fin group of the electrode flex group.

19. The apparatus of claim 14, wherein the electrode flex group is to determine corrosive exposure values on one or more areas of a first printed circuit board.

20. The apparatus of claim 19, wherein the multiplexer and the electrode fin group are incorporated into a second printed circuit board, the second printed circuit board is a sacrificial printed circuit board, the sacrificial printed circuit board is on one or more regions of the first printed circuit board.

21. The apparatus of claim 20, wherein the second printed circuit board is vertically oriented with respect to the first printed circuit board.

22. The apparatus of claim 21, wherein the second printed circuit board includes a Wheatstone bridge.

23. The apparatus of claim 20, wherein the second printed circuit board accesses a server management bus or an intelligent platform management interface (IPMI) bus.

24. The apparatus of claim 20, wherein the second printed circuit board is a replaceable unit, the second printed circuit board is on a header connected to a server motherboard, wherein the server motherboard is the first printed circuit board.

* * * * *